(12) United States Patent
Ramachandran et al.

(10) Patent No.: US 6,358,855 B1
(45) Date of Patent: Mar. 19, 2002

(54) CLEAN METHOD FOR RECESSED CONDUCTIVE BARRIERS

(75) Inventors: Ravikumar Ramachandran, Ossining, NY (US); Nicolas Nagel, Munich (DE); Christopher C. Parks, Poughkeepsie, NY (US)

(73) Assignees: Infineon Technologies AG, Munich (DE); International Business Machines Corporation, Armonk, NY (US)

(*) Notice: Subject to any disclaimer, the term of this patent is extended or adjusted under 35 U.S.C. 154(b) by 0 days.

(21) Appl. No.: 09/595,795

(22) Filed: Jun. 16, 2000

(51) Int. Cl.[7] ................... H01L 21/302; H01L 21/461
(52) U.S. Cl. ........................... 438/692; 438/745
(58) Field of Search ........................ 438/745, 692

(56) References Cited

U.S. PATENT DOCUMENTS

| 5,789,360 A | * | 8/1998 | Song et al. ............... 510/175 |
| 5,914,851 A | * | 6/1999 | Saenger et al. ............ 361/311 |
| 6,046,059 A | | 4/2000 | Shen et al. ................. 438/3 |
| 6,162,671 A | * | 12/2000 | Lee et al. ................. 438/238 |

* cited by examiner

Primary Examiner—Benjamin L. Utech
Assistant Examiner—Lynette T. Umez-Eronini

(57) ABSTRACT

A method for cleaning an oxidized diffusion barrier layer, in accordance with the present invention, includes providing a conductive diffusion barrier layer employed for preventing oxygen and metal diffusion therethrough and providing a wet chemical etchant including hydrofluoric acid. The diffusion barrier layer is etched with the wet chemical etchant to remove oxides from the diffusion barrier layer such that by employing the wet chemical etchant linear electrical behavior is achieved through the diffusion barrier layer.

15 Claims, 4 Drawing Sheets

CLEAN METHOD FOR RECESSED CONDUCTIVE BARRIERS

BACKGROUND

1. Technical Field

This disclosure relates to semiconductor fabrication and more particularly, to a method for improving recessed conductive barrier interfaces after chemical mechanical polishing.

2. Description of the Related Art

In stacked capacitor structures, a barrier layer is typically employed between a conductive plug, which connects to an access transistor and an electrode of the capacitor. The barrier layer may include TaSiN, which is typically used as a barrier for oxygen and metal diffusion. In stacked capacitor designs, which employ high dielectric constant materials, TaSiN is used as an oxygen and platinum diffusion barrier. For other device structures, TaSiN may used as a barrier for such materials like copper interconnects.

Where TaSiN is used as a recessed barrier, first the composite film (TaSiN) is deposited and then to achieve the recessed barrier, it undergoes a chemical mechanical polish (CMP) operation. The CMP operation oxidizes the surface and therefore causes contact resistance problems. These contact resistance problems include non-linear behavior in the electrical performance of the capacitor device and high contact resistance in the order of 100 kilo-Ohms or more.

Therefore, a need exists for a method for removing an oxidized layer from a top of a barrier layer, and in particular, a recessed barrier layer after chemical mechanical polishing.

SUMMARY OF THE INVENTION

A method for cleaning an oxidized diffusion barrier layer, in accordance with the present invention, includes providing a conductive diffusion barrier layer employed for preventing oxygen and metal diffusion therethrough and providing a wet chemical etchant including hydrofluoric acid. The diffusion barrier layer is etched with the wet chemical etchant to remove oxides from the diffusion barrier layer such that by employing the wet chemical etchant linear electrical behavior is achieved through the diffusion barrier layer.

A method for cleaning an oxidized diffusion barrier layer after chemical mechanical polishing, in accordance with the present invention, includes forming a conductive diffusion barrier layer, employed for preventing oxygen and metal diffusion therethrough, on a surface of an etch mask and in a recess formed in the etch mask, and polishing the conductive diffusion barrier layer to remove the conductive diffusion barrier layer from the surface of the etch mask such that the diffusion barrier layer remains in the recess. A wet chemical etchant including hydrofluoric acid is provided, and the diffusion barrier layer is etched in the recess with the wet chemical etchant to remove oxides from the diffusion barrier layer such that by employing the wet chemical etchant linear electrical behavior is achieved through the diffusion barrier layer.

A method for cleaning an oxidized diffusion barrier layer employed in a stacked capacitor structure, in accordance with the present invention, includes forming a conductive plug through a dielectric layer for contacting an access transistor, recessing the conductive plug below a surface of the dielectric layer, forming a conductive diffusion barrier layer, employed for preventing oxygen and metal diffusion therethrough, on a surface of an etch mask and in a recess formed in the etch mask, the etch mask formed on the dielectric layer, polishing the conductive diffusion barrier layer to remove the conductive diffusion barrier layer from the surface of the etch mask such that the diffusion barrier layer remains in the recess, providing a wet chemical etchant including hydrofluoric acid, etching the diffusion barrier layer in the recess with the wet chemical etchant to remove oxides from the diffusion barrier layer such that by employing the wet chemical etchant linear electrical behavior is achieved through the diffusion barrier layer and patterning an electrode in contact with the diffusion barrier layer in the recess.

In other methods, the barrier layer may preferably include tantalum. Suitable materials for the barrier layer may include TaSiN, TaAlN, TiAlN and TiSiN. The wet chemical etchant may include diluted hydrofluoric acid, or a buffered hydrofluoric acid. The diluted hydrofluoric acid may include a dilution ratio of parts water to parts hydrofluoric acid of between about 10:1 to about 200:1. The step of polishing the conductive barrier layer may include the step of polishing by chemical mechanical polishing employing a slurry. The slurry may include an oxidizing agent, which oxidizes the conductive barrier layer. The electrode preferably includes platinum.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication and more particularly, to a method for improving recessed conductive barrier interfaces. Although the present invention may be employed on a barrier layer at any time, the invention is preferably employed after a processing step which causes oxidation of the barrier layer, for example, after a chemical mechanical polish, after exposure to oxygen or after other processing steps. The present invention employs a wet etch process to remove oxides formed on a surface of a barrier layer. In a preferred embodiment, dilute HF is employed as a post CMP step for recessed conductive barriers for stacked capacitor cells. Barrier materials may include TaSiN, TaAlN, TiAlN, TiSiN and others. To form a recessed barrier, CMP is preferably used. The chemistry used to polish the barrier layer oxidizes the surface of the barrier, and provides for a high contact resistance through the barrier layer. By employing a diluted HF clean, the surface oxygen concentration is reduced to make the device work efficiently, and barrier performs its intended purpose. TaSiN is illustratively used as an example herein; however, similar results may be achieved from other barrier materials as well.

Figure 1:
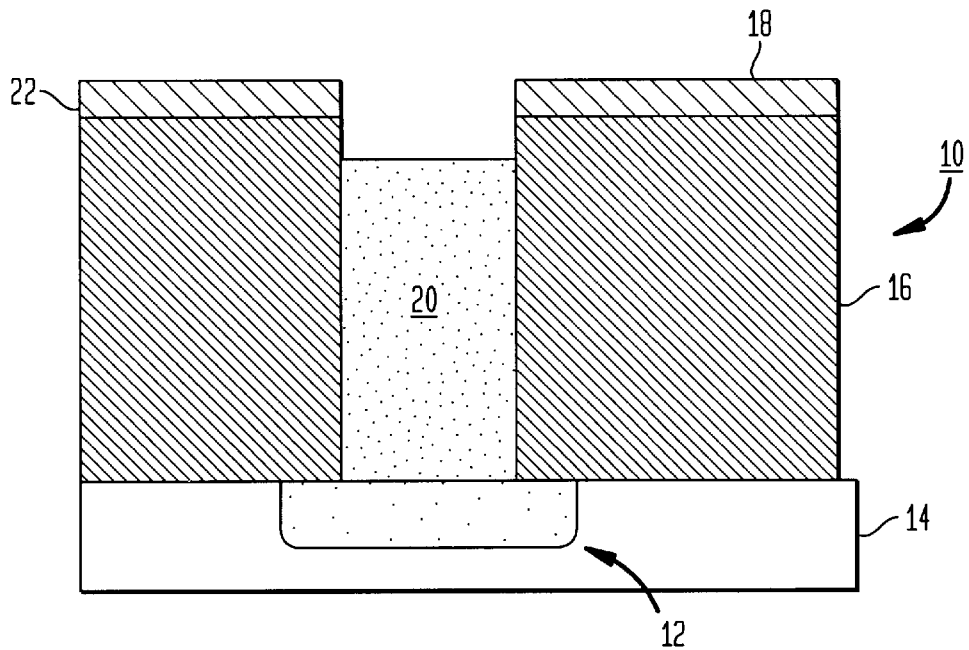
FIG. 1 is a cross-sectional view of a partially fabricated stacked capacitor cell on which the present invention may be applied.

Referring now in specific detail to the drawings in which like reference numerals identify similar or identical elements throughout the several views, and initially to FIG. 1, a cross-sectional view of a partially fabricated stacked capacitor cell 10 is illustratively shown. An access transistor 12 is formed in a substrate 14, for example a monocrystalline silicon substrate. A dielectric layer 16, for example, TEOS is deposited and patterned using a mask layer 18 to form a contact or plug 20 therethrough. Mask layer 18 may include TEOS or silicon nitride, for example. Plug 20 may preferably include doped polysilicon or other conductive materials. Plug 20 is recessed below a top surface 22 of dielectric layer 16.

Figure 2:
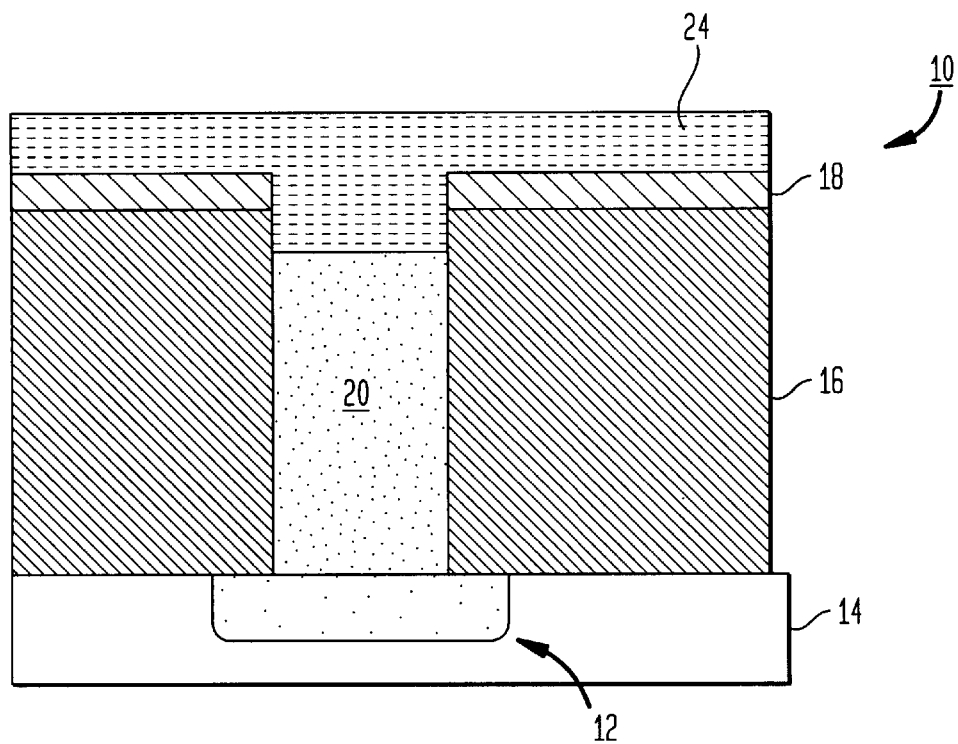
FIG. 2 is a cross-sectional view of the partially fabricated stacked capacitor cell of FIG. 1 showing a barrier layer formed on which the present invention may be applied.

Referring to FIG. 2, a barrier layer 24 is formed by depositing a composite material over the surface of dielectric layer 16 and in the recess formed by recessing plug 20. The composite material may be formed by employing a chemical vapor deposition (CVD), physical vapor deposition (PVD) or sputtering process. The composite material may include TaSiN, TaAlN, TiAlN, TiSiN or other materials suitable for prevention of diffusion of oxygen and other atoms/ions through the barrier layer.

Figure 3:
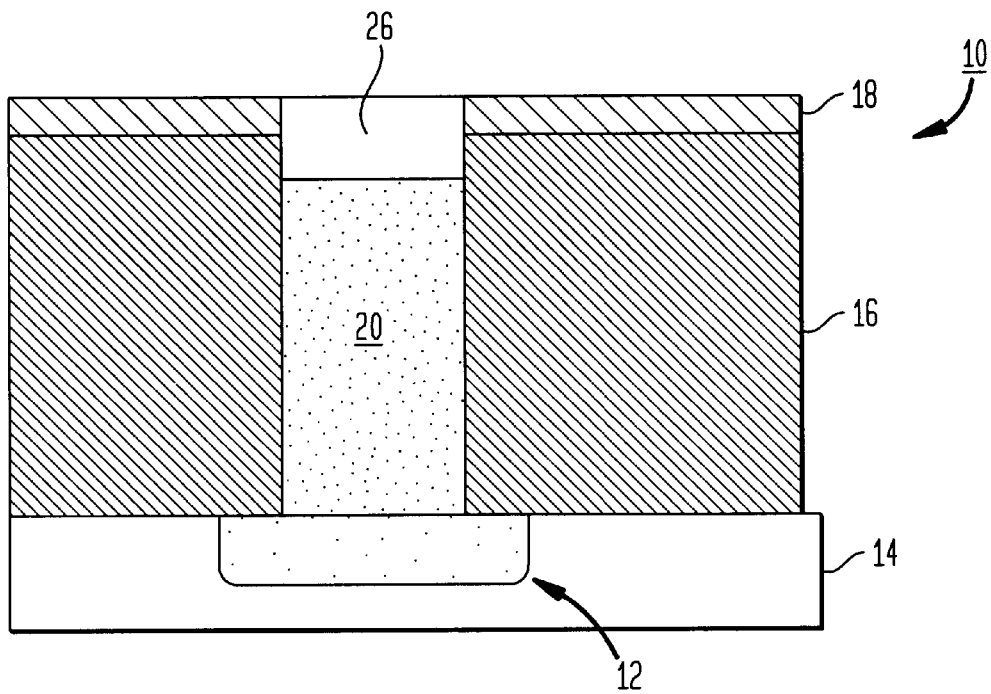
FIG. 3 is a cross-sectional view of the partially fabricated stacked capacitor cell of FIG. 2 showing the barrier layer recessed in accordance with the present invention.

Referring to FIG. 3, a chemical mechanical polishing step is performed to planarize the composite material of barrier layer 24 to form a barrier 26 on top of plug 20. In one illustrative example, the slurry for the CMP may include fine alumina particles and an oxidizer (e.g., diammonium tetraborate tetrahydrate) at a pH of about 5.3. The CMP operation may illustratively include a platen speed of about 100 rpm, a carrier speed of about 100 rpm, a down force of about 4 psi, a back pressure of about 0 psi and a flow rate for the slurry of about 130 ml/min. In this illustrative example, the selectivity that is obtained is 3:1 between a barrier 26 of TaSiN and a dielectric layer 18 of SiN. These parameters are set forth for purposes of illustration and should not be construed as limiting the invention. Due to the CMP, an oxide forms on barrier 26.

Figure 4:
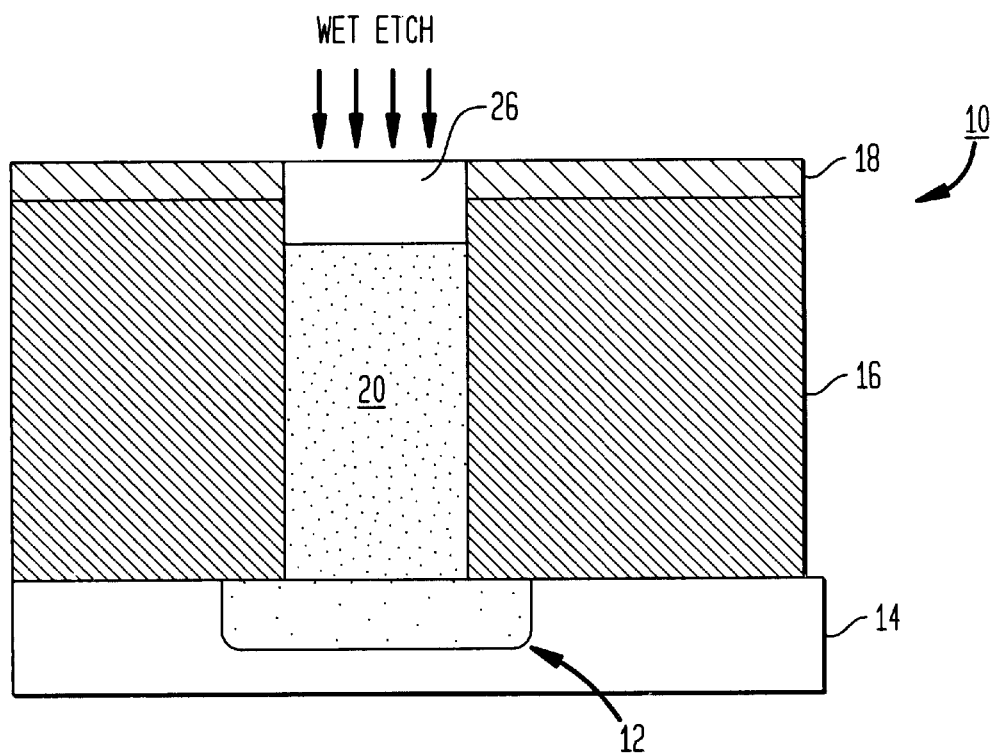
FIG. 4 is a cross-sectional view of the partially fabricated stacked capacitor cell of FIG. 3 showing the barrier layer etched with a wet chemical in accordance with the present invention.

Referring to FIG. 4, advantageously, a wet chemical is employed to reduce the oxygen in barrier 26. The wet chemical is preferably diluted HF. Other wet chemicals may be used as well, for example, a buffered HF (BHF), such as, a mixture of ammonium fluoride and HF, may be employed. The oxidized surface film on barrier 26 most likely includes an oxidized silicon and tantalum component, if TaSiN is used. HF advantageously etches both silicon oxide and tantalum oxide. Surprisingly, by removing the oxide of the barrier layer with HF, diluted HF or BHF yields linear electrical characteristics through barrier 26 during operation of cell 10. In one embodiment, diluted HF is employed. The desired HF composition is achieved by dilution with water in a ratio of between about 10 parts water and 200 parts water to one part HF (e.g., 10:1 to 200:1). In preferred embodiments, wet etching with HF may be performed for between about 10 seconds to about 6 minutes depending on the application. Barrier 26 may be about 10 nm or more in thickness.

Figure 5:
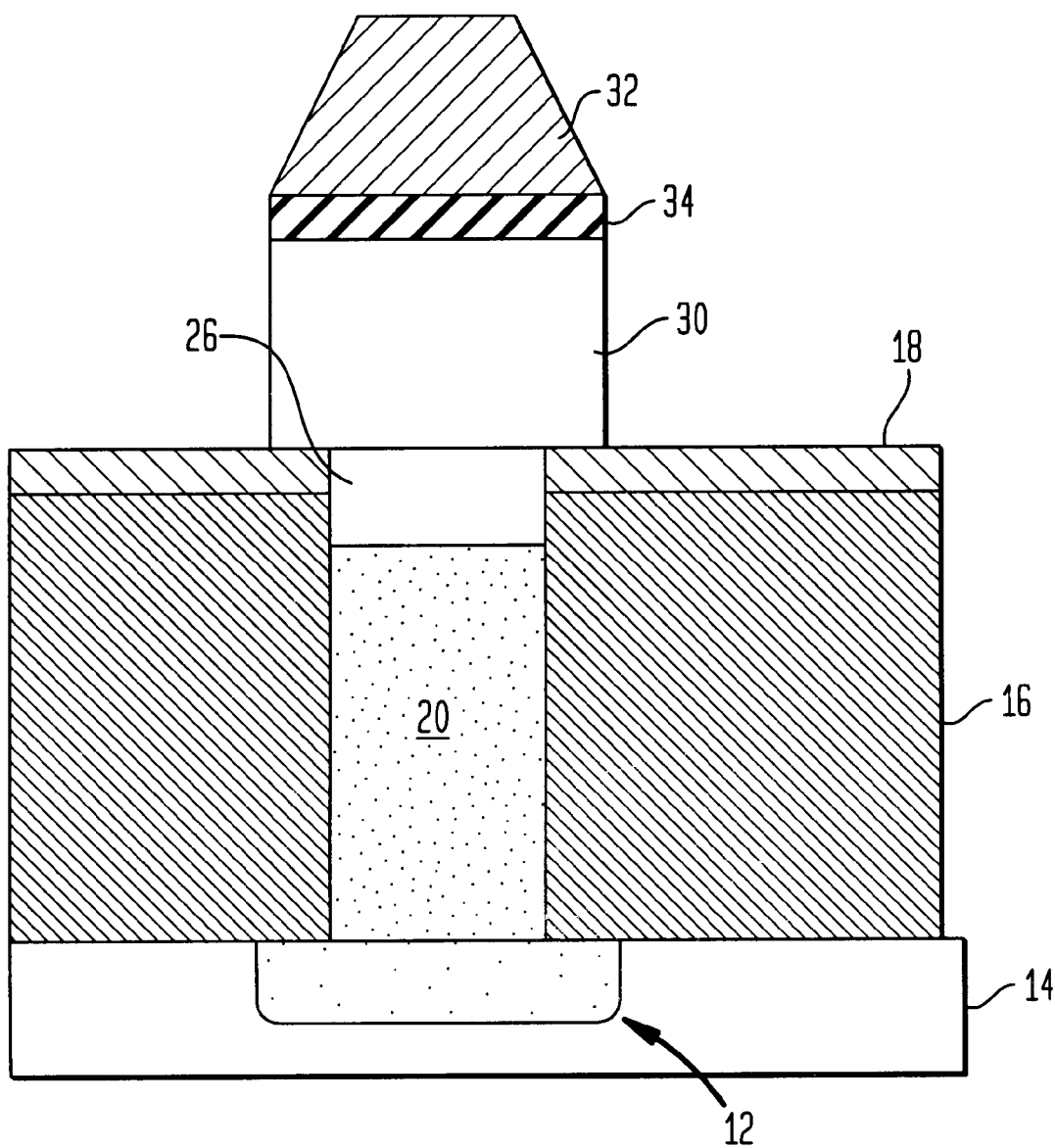
FIG. 5 is a cross-sectional view of the partially fabricated stacked capacitor cell of FIG. 4 showing an electrode formed in accordance with the present invention.

Referring to FIG. 5, an electrode 30 is formed over barrier 26. Electrode 30 may include platinum or other highly conductive materials. A mask layer 32, such as, for example, boro-silicate glass, (BSG) may be employed which is selectively etchable relative to a layer 34. Layer 34 is selectively etchable relative to electrode 30. Layer 34 may include, for example TiN. Layers 32 and 34 are used to pattern electrode 30 and are subsequently removed. Barrier 26 forms a diffusion and oxide barrier between plug 20 and electrode 30. Subsequent steps include forming a high dielectric constant material over the electrode 30 and then forming a second electrode over the high dielectric constant material.

ANALYSIS OF BARRIER

The analysis of barrier 26 by the inventors of the present invention included measuring the surface oxygen concentration by secondary ion mass spectroscopy (SIMS) and measuring the contact resistance of a known structure through its I-V characteristics.

The surface oxygen concentration was monitored at various stages of the barrier processing. SIMS was performed with cesium and negative ion secondaries on the samples. A comparison sample (sample 1 of Table 1) included a Pt matrix which has a very low sensitivity to oxygen as compared to other matrices, such as, silicon (as determined by comparing ion implant references into Pt and into silicon). To compare oxygen, integrals of the oxygen were taken from the SIMS data below and compared to CMP without cleaning (sample 2 of Table 1) another set of data. This comparison relies on the complex SIMS matrix effects being similar for the samples, as they are in all profiles of Pt/TaSiN.

TABLE 1

Normalized oxygen concentrations on TaSiN surface as measured by SIMS for three different clean chemistries.

| Sample ID | Description | O Integral (counts) | F Integral (counts) |
|---|---|---|---|
| 1 | Pt on native TaSiN | no peak | low |
| 2 | CMP without Clean | 1.8 E5 = 100% | 993 counts |
| 3 | Clean1 100:1 diluted HF, 2 min | 9.6 E4 = 53% | 6.6 E3 |
| 4 | Clean2 diluted mixture of sulfuric acid and hydrogen peroxide, 120 s | 1.8 E5 = 100% | 2.0 E3 |
| 5 | Clean3 diluted mixture of ammonium hydroxide and hydrogen peroxide (e.g., SC1 or APM), 120 s | 1.2 E5 = 67% | 1.5 E3 |

From Table 1, diluted HF surprisingly reduces the surface oxygen concentration on TaSiN down to 53%. Different processing conditions with diluted HF were performed by the inventors, and the results are compiled in Table 2.

TABLE 2

Normalized oxygen concentrations on TaSiN surface as measured by SIMS for three different processing conditions with diluted HF.

| Sample ID | Description | O Integral (counts) | F Integral (counts) | Comments |
|---|---|---|---|---|
| 6 | Post CMP without Clean | 3.3 E5 = 100% | 2.6 E3 | |
| 7 | DHF-10:1 for 2 min | 1.2 E5 = 36% | 2.3 E4 | TaSiN region appears thinner - maybe etched |

TABLE 2-continued

Normalized oxygen concentrations on TaSiN surface as measured by SIMS for three different processing conditions with diluted HF.

| Sample ID | Description | O Integral (counts) | F Integral (counts) | Comments |
|---|---|---|---|---|
| 8 | DHF-100:1 for 4 min. | 1.7 E5 = 51% | 1.3 E4 | |
| 9 | DHF-100:1 for 6 min. | 1.8 E5 = 54% | 2.0 E4 | |
| 2 (again see Table 1) | CMP without clean | 2.5 E5 counts | | prior sample for comparison |

The table shows that the HF exposure reduces the large oxygen peak from the CMP. However, there is little difference between the various processing conditions with diluted HF. Furthermore, with an aggressive 10:1 diluted HF (DHF) mixture, there may also be thinning of the TaSiN barrier material. A 10:1 DHF solution may be employed for less time to reduce the chance of etching.

ELECTRICAL DATA

Figure 6A:
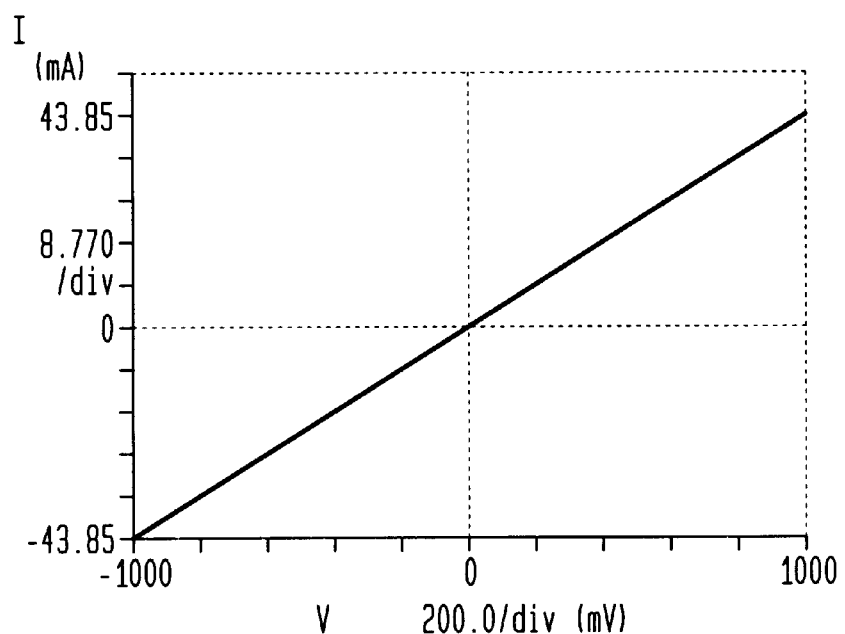
FIGS. 6A and 6B are I-V curves showing linear characteristics of the barrier layer cleaned in accordance with the present invention.
Figure 6B:
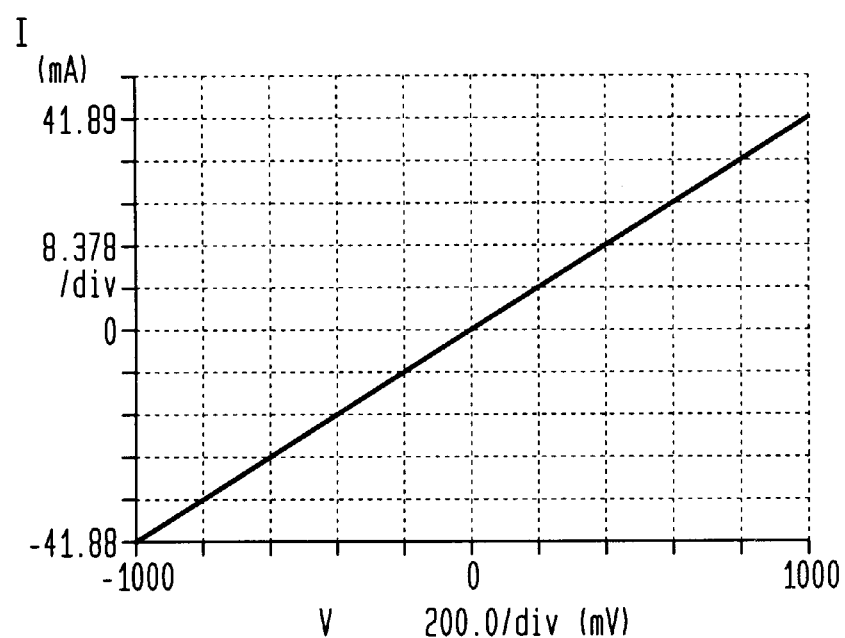

Referring to FIGS. 6A and 6B, contact resistance at the barrier interface is estimated through an I-V (current versus voltage) measurement. The new dilute HF clean provides a resistance which is measured to be between about 25 to 40 kΩ which is within the target range, which satisfies the proper performance of barrier 26. The behavior is advantageously linear in nature. FIG. 6A shows an I-V curve for a barrier cleaned in 100:1 DHF for 4 minutes. FIG. 6B shows an I-V curve for a barrier cleaned in 10:1 DHF for 2 minutes.

The DHF based wet clean in accordance with the present invention is effective in reducing the surface oxygen concentration on a chemical mechanically polished TaSiN surface or other barrier surfaces. Advantageously, the I-V characteristics show linear behavior with the interface resistance between 25 to 40 kΩ. Although this value is higher than the ideal contact resistance, linear electrical behavior is surprisingly obtained. This linear behavior is not repeatedly exhibited by other etch processes, such as, for example, diluted sulfuric acid and peroxide mixtures.

Having described preferred embodiments for a method for cleaning recessed conductive barriers (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for cleaning an oxidized diffusion barrier layer formed in a recess of a stacked capacitor after chemical mechanical polishing comprising:
   forming a conductive diffusion barrier layer on a surface of an etch mask and in a recess formed in the etch mask;
   polishing the conductive diffusion barrier layer to remove the conductive diffusion barrier layer from the surface of the etch mask such that the conductive diffusion barrier layer remains in the recess;
   providing a wet chemical etchant comprising hydrofluoric acid, and
   etching the conductive diffusion barrier layer in the recess with the wet chemical etchant to reduce oxides on the conductive diffusion barrier layer to achieve current voltage (I-V) linear behavior with interface resistance through the conductive diffusion barrier layer.

2. The method as recited in claim 1, wherein the barrier layer includes tantalum.

3. The method as recited in claim 1, wherein the barrier layer is selected from the group consisting of TaSiN, TaAlN, TiAlN and TiSiN.

4. The method as recited in claim 1, wherein the wet chemical etchant comprises dilute hydrofluoric acid.

5. The method as recited in claim 4, wherein the dilute hydrofluoric acid comprises a dilution ratio of parts water to parts hydrofluoric acid of between about 10:1 to about 200:1.

6. The method as recited in claim 1, wherein the step of polishing the conductive barrier layer comprises the step of polishing by chemical mechanical polishing employing a slurry.

7. The method as recited in claim 6, wherein the slurry includes an oxidizing agent, which oxidizes the conductive barrier layer.

8. A method for cleaning an oxidized diffusion barrier layer in a stacked capacitor structure comprising:
   forming a conductive plug through a dielectric layer for contacting an access transistor;
   recessing the conductive plug below a surface of the dielectric layer;
   forming a conductive diffusion barrier layer, employed for preventing oxygen and metal diffusion therethrough, on a surface of an etch mask and in a recess formed in the etch mask, the etch mask formed on the dielectric layer;
   polishing the conductive diffusion barrier layer to remove the conductive diffusion barrier layer from the surface of the etch mask such that the diffusion barrier layer remains in the recess;
   providing a wet chemical etchant comprising hydrofluoric acid; etching the diffusion barrier layer in the recess with the wet chemical etchant to remove oxides from the diffusion barrier layer to achieve current-voltage (I-V) linear behavior with interface resistance through the conductive diffusion barrier; and
   patterning an electrode in contact with the conductive diffusion barrier layer in the recess.

9. The method as recited in claim 8, wherein the barrier layer includes tantalum.

10. The method as recited in claim 8, wherein the conductive diffusion barrier layer is selected from the group consisting of TaSiN, TaAlN, TiAlN and TiSiN.

11. The method as recited in claim 8, wherein the wet chemical etchant comprises dilute hydrofluoric acid.

12. The method as recited in claim 11, wherein the dilute hydrofluoric acid comprises a dilution ratio of parts water to parts hydrofluoric acid of between about 10:1 to about 200:1.

13. The method as recited in claim 8, wherein the step of polishing the conductive barrier layer comprises the step of polishing by chemical mechanical polishing employing a slurry.

14. The method as recited in claim 13, wherein the slurry comprises an oxidizing agent that oxidizes the conductive barrier layer.

15. The method as recited in claim 8, wherein the electrode comprises platinum.

* * * * *